(12) United States Patent  
Aytug et al.

(10) Patent No.: US 8,741,158 B2
(45) Date of Patent: Jun. 3, 2014

(54) SUPERHYDROPHOBIC TRANSPARENT GLASS (STG) THIN FILM ARTICLES

(75) Inventors: Tolga Aytug, Knoxville, TN (US); John T. Simpson, Clinton, TN (US); David K. Christen, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 207 days.

(21) Appl. No.: 12/915,183

(22) Filed: Oct. 29, 2010

(65) Prior Publication Data
US 2012/0088066 A1    Apr. 12, 2012

Related U.S. Application Data

(63) Continuation-in-part of application No. 12/901,072, filed on Oct. 8, 2010.

(51) Int. Cl.
*B44C 1/22*    (2006.01)

(52) U.S. Cl.
USPC ............... 216/11; 216/37; 216/56; 427/256; 977/700; 977/888

(58) Field of Classification Search
USPC ................................ 216/11, 37, 56; 427/256
See application file for complete search history.

(56) References Cited

U.S. PATENT DOCUMENTS

| | | | |
|---|---|---|---|
| 2,221,709 A | 11/1940 | Hood et al. | |
| 2,286,275 A | 6/1942 | Hood et al. | |
| 2,315,328 A | 3/1943 | Hood et al. | |
| 3,790,475 A | 2/1974 | Eaton | |
| 3,931,428 A | 1/1976 | Reick | |
| 4,214,919 A | 7/1980 | Young | |
| 4,326,509 A | 4/1982 | Usukura | |
| 4,377,608 A | 3/1983 | Daudt et al. | |
| 4,829,093 A | 5/1989 | Matsukawa et al. | |
| 5,086,764 A | 2/1992 | Gilman | |
| 5,096,882 A | 3/1992 | Kato et al. | |
| 5,154,928 A | 10/1992 | Andrews | |
| 5,164,363 A | 11/1992 | Eguchi et al. | |
| 5,180,845 A | 1/1993 | Higley et al. | |

(Continued)

FOREIGN PATENT DOCUMENTS

CN    101225226    7/2008
CN    100540153    9/2009

(Continued)

OTHER PUBLICATIONS

Ailan et al., "Studies on super-hydrophobic films", Progress in Chemistry (2006).

(Continued)

*Primary Examiner* — Shamim Ahmed
(74) *Attorney, Agent, or Firm* — Novak Druce Connolly Bove + Quigg LLP

(57)    ABSTRACT

An article having a nanostructured surface and a method of making the same are described. The article can include a substrate and a nanostructured layer bonded to the substrate. The nanostructured layer can include a plurality of spaced apart nanostructured features comprising a contiguous, protrusive material and the nanostructured features can be sufficiently small that the nanostructured layer is optically transparent. A surface of the nanostructured features can be coated with a continuous hydrophobic coating. The method can include providing a substrate; depositing a film on the substrate; decomposing the film to form a decomposed film; and etching the decomposed film to form the nanostructured layer.

20 Claims, 6 Drawing Sheets

(56) References Cited

U.S. PATENT DOCUMENTS

| | | |
|---|---|---|
| 5,215,635 A | 6/1993 | Stein et al. |
| 5,258,221 A | 11/1993 | Meirowitz et al. |
| 5,264,722 A | 11/1993 | Tonucci et al. |
| 5,266,558 A | 11/1993 | Lichtenberg et al. |
| 5,432,151 A | 7/1995 | Russo et al. |
| 5,437,894 A | 8/1995 | Ogawa et al. |
| 5,510,323 A | 4/1996 | Kamo et al. |
| 5,543,630 A | 8/1996 | Bliss et al. |
| 5,650,378 A | 7/1997 | Iijima et al. |
| 5,736,249 A | 4/1998 | Smith et al. |
| 5,739,086 A | 4/1998 | Goyal et al. |
| 5,741,377 A | 4/1998 | Goyal et al. |
| 5,753,735 A | 5/1998 | Okoroafor et al. |
| 5,801,105 A | 9/1998 | Yano et al. |
| 5,846,912 A | 12/1998 | Selvamanickam et al. |
| 5,872,080 A | 2/1999 | Arendt et al. |
| 5,898,020 A | 4/1999 | Goyal et al. |
| 5,958,599 A | 9/1999 | Goyal et al. |
| 5,964,966 A | 10/1999 | Goyal et al. |
| 5,968,877 A | 10/1999 | Budai et al. |
| 6,040,251 A | 3/2000 | Caldwell |
| 6,074,990 A | 6/2000 | Pique et al. |
| 6,077,344 A | 6/2000 | Shoup et al. |
| 6,106,615 A | 8/2000 | Goyal et al. |
| 6,114,287 A | 9/2000 | Lee et al. |
| 6,147,033 A | 11/2000 | Youm |
| 6,150,034 A | 11/2000 | Paranthaman et al. |
| 6,151,610 A | 11/2000 | Senn et al. |
| 6,154,599 A | 11/2000 | Rey |
| 6,156,376 A | 12/2000 | Paranthaman et al. |
| 6,159,610 A | 12/2000 | Paranthaman et al. |
| 6,174,352 B1 | 1/2001 | Semerdjian et al. |
| 6,180,570 B1 | 1/2001 | Goyal et al. |
| 6,190,752 B1 | 2/2001 | Do et al. |
| 6,214,772 B1 | 4/2001 | Iijima et al. |
| 6,231,779 B1 | 5/2001 | Chiang et al. |
| 6,235,383 B1 | 5/2001 | Hong et al. |
| 6,235,402 B1 | 5/2001 | Shoup et al. |
| 6,261,704 B1 | 7/2001 | Paranthaman et al. |
| 6,265,353 B1 | 7/2001 | Kinder et al. |
| 6,270,908 B1 | 8/2001 | Williams et al. |
| 6,319,868 B1 | 11/2001 | Gani et al. |
| 6,331,199 B1 | 12/2001 | Goyal et al. |
| 6,331,329 B1 | 12/2001 | McCarthy et al. |
| 6,361,598 B1 | 3/2002 | Balachandran et al. |
| 6,375,768 B1 | 4/2002 | Goyal |
| 6,384,293 B1 | 5/2002 | Marcussen |
| 6,399,154 B1 | 6/2002 | Williams et al. |
| 6,440,211 B1 | 8/2002 | Beach et al. |
| 6,447,714 B1 | 9/2002 | Goyal et al. |
| 6,451,450 B1 | 9/2002 | Goyal et al. |
| 6,468,591 B1 | 10/2002 | Paranthaman et al. |
| 6,486,100 B1 | 11/2002 | Lee et al. |
| 6,515,066 B2 | 2/2003 | Allen et al. |
| 6,537,689 B2 | 3/2003 | Schoop et al. |
| 6,555,256 B1 | 4/2003 | Christen et al. |
| 6,599,346 B2 | 7/2003 | Goyal et al. |
| 6,602,313 B2 | 8/2003 | Goyal et al. |
| 6,607,313 B1 | 8/2003 | Farries et al. |
| 6,607,838 B2 | 8/2003 | Goyal et al. |
| 6,607,839 B2 | 8/2003 | Goyal et al. |
| 6,610,413 B2 | 8/2003 | Goyal et al. |
| 6,610,414 B2 | 8/2003 | Goyal et al. |
| 6,632,539 B1 | 10/2003 | Iijima et al. |
| 6,635,097 B2 | 10/2003 | Goyal et al. |
| 6,645,313 B2 | 11/2003 | Goyal et al. |
| 6,657,229 B1 | 12/2003 | Eguchi et al. |
| 6,657,792 B2 | 12/2003 | Eguchi et al. |
| 6,663,976 B2 | 12/2003 | Beach et al. |
| 6,670,308 B2 | 12/2003 | Goyal |
| 6,673,646 B2 | 1/2004 | Droopad |
| 6,716,795 B2 | 4/2004 | Norton et al. |
| 6,740,421 B1 | 5/2004 | Goyal |
| 6,756,139 B2 | 6/2004 | Jia et al. |
| 6,764,770 B2 | 7/2004 | Paranthaman |
| 6,782,988 B2 | 8/2004 | Cantacuzene et al. |
| 6,784,139 B1 | 8/2004 | Sankar et al. |
| 6,790,253 B2 | 9/2004 | Goyal et al. |
| 6,797,030 B2 | 9/2004 | Goyal et al. |
| 6,800,354 B2 | 10/2004 | Baumann et al. |
| 6,833,186 B2 | 12/2004 | Perrine et al. |
| 6,846,344 B2 | 1/2005 | Goyal et al. |
| 6,867,447 B2 | 3/2005 | Summerfelt |
| 6,872,441 B2 | 3/2005 | Baumann et al. |
| 6,872,988 B1 | 3/2005 | Goyal |
| 6,884,527 B2 | 4/2005 | Groves et al. |
| 6,890,369 B2 | 5/2005 | Goyal et al. |
| 6,899,928 B1 | 5/2005 | Groves et al. |
| 6,902,600 B2 | 6/2005 | Goyal et al. |
| 6,916,301 B1 | 7/2005 | Clare |
| 6,921,741 B2 | 7/2005 | Arendt et al. |
| 6,956,012 B2 | 10/2005 | Paranthaman et al. |
| 6,983,093 B2 | 1/2006 | Fraval et al. |
| 6,984,857 B2 | 1/2006 | Udayakumar et al. |
| 7,020,899 B1 | 4/2006 | Carlopia |
| 7,087,113 B2 | 8/2006 | Goyal |
| 7,090,785 B2 | 8/2006 | Chiang et al. |
| 7,193,015 B1 | 3/2007 | Mabry et al. |
| 7,208,044 B2 | 4/2007 | Zurbuchen et al. |
| 7,258,731 B2 | 8/2007 | D'Urso et al. |
| 7,265,256 B2 | 9/2007 | Artenstein |
| 7,267,881 B2 | 9/2007 | Weberg et al. |
| 7,323,581 B1 | 1/2008 | Gardiner et al. |
| 7,338,907 B2 | 3/2008 | Li et al. |
| 7,341,978 B2 | 3/2008 | Gu et al. |
| 7,485,383 B2 | 2/2009 | Branson et al. |
| 7,524,531 B2 | 4/2009 | Axtell et al. |
| 7,553,799 B2 | 6/2009 | Paranthaman et al. |
| 7,642,309 B2 | 1/2010 | Tarng et al. |
| 7,754,289 B2 | 7/2010 | Simpson |
| 7,758,928 B2 | 7/2010 | Bunce et al. |
| 7,879,161 B2 | 2/2011 | Goyal |
| 7,892,606 B2 | 2/2011 | Thies et al. |
| 7,914,158 B2 | 3/2011 | Schulz et al. |
| 7,923,075 B2 | 4/2011 | Yeung et al. |
| 7,998,919 B2 | 8/2011 | Rong et al. |
| 8,017,234 B2 | 9/2011 | Jin et al. |
| 8,119,314 B1 | 2/2012 | Heuft et al. |
| 8,119,315 B1 | 2/2012 | Heuft et al. |
| 8,153,233 B2 | 4/2012 | Sheng et al. |
| 8,216,674 B2 | 7/2012 | Simpson et al. |
| 2002/0142150 A1 | 10/2002 | Baumann et al. |
| 2002/0149584 A1 | 10/2002 | Simpson et al. |
| 2002/0150723 A1 | 10/2002 | Oles et al. |
| 2002/0150725 A1 | 10/2002 | Nun et al. |
| 2002/0150726 A1 | 10/2002 | Nun et al. |
| 2002/0151245 A1 | 10/2002 | Hofmann et al. |
| 2003/0013795 A1 | 1/2003 | Nun et al. |
| 2003/0122269 A1 | 7/2003 | Weber et al. |
| 2003/0185741 A1 | 10/2003 | Matyjaszewski et al. |
| 2003/0230112 A1 | 12/2003 | Ikeda et al. |
| 2004/0003768 A1 | 1/2004 | Goyal |
| 2004/0095658 A1 | 5/2004 | Buretea et al. |
| 2004/0163758 A1 | 8/2004 | Kagan et al. |
| 2004/0202872 A1 | 10/2004 | Fang |
| 2005/0129962 A1 | 6/2005 | Amidaiji et al. |
| 2005/0176331 A1 | 8/2005 | Martin et al. |
| 2005/0239658 A1 | 10/2005 | Paranthaman et al. |
| 2005/0239659 A1 | 10/2005 | Xiong et al. |
| 2006/0019114 A1 | 1/2006 | Thies et al. |
| 2006/0024478 A1 | 2/2006 | D'Urso et al. |
| 2006/0024508 A1 | 2/2006 | D'Urso et al. |
| 2006/0029808 A1 | 2/2006 | Zhai et al. |
| 2006/0099397 A1 | 5/2006 | Thierauf et al. |
| 2006/0110541 A1 | 5/2006 | Russell et al. |
| 2006/0110542 A1 | 5/2006 | Dietz et al. |
| 2006/0111249 A1 | 5/2006 | Shinohara |
| 2006/0216476 A1 | 9/2006 | Ganti et al. |
| 2006/0234066 A1 | 10/2006 | Zurbuchen |
| 2006/0246297 A1 | 11/2006 | Sakoske et al. |
| 2006/0257643 A1 | 11/2006 | Birger |
| 2006/0263516 A1 | 11/2006 | Jones et al. |
| 2006/0275595 A1 | 12/2006 | Thies et al. |
| 2006/0276344 A1 | 12/2006 | Paranthaman et al. |

(56) References Cited

U.S. PATENT DOCUMENTS

| | | |
|---|---|---|
| 2006/0288774 A1 | 12/2006 | Jacob et al. |
| 2007/0009657 A1 | 1/2007 | Zhang et al. |
| 2007/0027232 A1 | 2/2007 | Walsh et al. |
| 2007/0098806 A1 | 5/2007 | Ismail et al. |
| 2007/0166464 A1 | 7/2007 | Acatay et al. |
| 2007/0170393 A1 | 7/2007 | Zhang |
| 2007/0178227 A1 | 8/2007 | Hunt et al. |
| 2007/0184247 A1 | 8/2007 | Simpson et al. |
| 2007/0196401 A1 | 8/2007 | Naruse et al. |
| 2007/0215004 A1 | 9/2007 | Kuroda et al. |
| 2007/0231542 A1 | 10/2007 | Deng et al. |
| 2007/0237812 A1 | 10/2007 | Patel et al. |
| 2007/0298216 A1 | 12/2007 | Jing et al. |
| 2008/0004691 A1* | 1/2008 | Weber et al. ............... 623/1.16 |
| 2008/0015298 A1 | 1/2008 | Xiong et al. |
| 2008/0097143 A1 | 4/2008 | Califorrniaa |
| 2008/0176749 A1 | 7/2008 | Goyal |
| 2008/0185343 A1 | 8/2008 | Meyer et al. |
| 2008/0199657 A1 | 8/2008 | Capron et al. |
| 2008/0213853 A1 | 9/2008 | Garcia et al. |
| 2008/0221009 A1 | 9/2008 | Kanagasabapathy |
| 2008/0221263 A1 | 9/2008 | Kanagasabapathy et al. |
| 2008/0241581 A1 | 10/2008 | Zurbuchen et al. |
| 2008/0248263 A1 | 10/2008 | Kobrin |
| 2008/0248281 A1 | 10/2008 | Nakaguma et al. |
| 2008/0268288 A1* | 10/2008 | Jin ............................. 428/800 |
| 2008/0280699 A1 | 11/2008 | Jarvholm |
| 2008/0286556 A1 | 11/2008 | D'Urso et al. |
| 2008/0299288 A1* | 12/2008 | Kobrin et al. ............... 427/2.1 |
| 2009/0011222 A1 | 1/2009 | Xiu et al. |
| 2009/0018249 A1 | 1/2009 | Kanagasabapathy et al. |
| 2009/0025508 A1 | 1/2009 | Liao et al. |
| 2009/0029145 A1 | 1/2009 | Thies et al. |
| 2009/0042469 A1 | 2/2009 | Simpson |
| 2009/0076430 A1 | 3/2009 | Simpson et al. |
| 2009/0081456 A1 | 3/2009 | Goyal |
| 2009/0088325 A1 | 4/2009 | Goyal et al. |
| 2009/0118420 A1 | 5/2009 | Zou et al. |
| 2009/0136741 A1 | 5/2009 | Zhang et al. |
| 2009/0253867 A1 | 10/2009 | Takahashi et al. |
| 2009/0264836 A1 | 10/2009 | Roe et al. |
| 2009/0298369 A1 | 12/2009 | Koene et al. |
| 2009/0318717 A1 | 12/2009 | Virtanen et al. |
| 2010/0004373 A1* | 1/2010 | Zhu et al. ..................... 524/448 |
| 2010/0021692 A1 | 1/2010 | Bormashenko et al. |
| 2010/0021745 A1 | 1/2010 | Simpson et al. |
| 2010/0068434 A1 | 3/2010 | Steele et al. |
| 2010/0090345 A1 | 4/2010 | Sun |
| 2010/0112204 A1 | 5/2010 | Marte et al. |
| 2010/0129258 A1 | 5/2010 | Diez Gil et al. |
| 2010/0130082 A1 | 5/2010 | Lee et al. |
| 2010/0184913 A1 | 7/2010 | Ebbrecht et al. |
| 2010/0200512 A1 | 8/2010 | Chase et al. |
| 2010/0239824 A1 | 9/2010 | Weitz et al. |
| 2010/0272987 A1 | 10/2010 | Marte et al. |
| 2010/0286582 A1 | 11/2010 | Simpson et al. |
| 2010/0291723 A1 | 11/2010 | Low et al. |
| 2010/0326699 A1 | 12/2010 | Greyling |
| 2010/0330278 A1 | 12/2010 | Choi et al. |
| 2011/0008401 A1 | 1/2011 | Ranade et al. |
| 2011/0041912 A1 | 2/2011 | Ragogna et al. |
| 2011/0042004 A1 | 2/2011 | Schubert |
| 2011/0070180 A1 | 3/2011 | Ranade et al. |
| 2011/0084421 A1 | 4/2011 | Soane et al. |
| 2011/0095389 A1 | 4/2011 | Curello et al. |
| 2011/0143094 A1 | 6/2011 | Kitada et al. |
| 2011/0150765 A1 | 6/2011 | Boyden et al. |
| 2011/0160374 A1 | 6/2011 | Jin et al. |
| 2011/0177320 A1 | 7/2011 | Mehrabi et al. |
| 2011/0195181 A1 | 8/2011 | Jin et al. |
| 2011/0217544 A1 | 9/2011 | Young et al. |
| 2011/0223415 A1 | 9/2011 | Drescher et al. |
| 2011/0226738 A1 | 9/2011 | Lee |
| 2011/0229667 A1 | 9/2011 | Jin et al. |
| 2011/0232522 A1 | 9/2011 | Das et al. |
| 2011/0250353 A1 | 10/2011 | Caruso et al. |
| 2011/0263751 A1 | 10/2011 | Mayer et al. |
| 2011/0277393 A1 | 11/2011 | Hohmann, Jr. |
| 2012/0028022 A1 | 2/2012 | Brugger et al. |
| 2012/0028342 A1 | 2/2012 | Ismagilov et al. |
| 2012/0029090 A1 | 2/2012 | Brugger et al. |
| 2012/0041221 A1 | 2/2012 | McCarthy et al. |
| 2012/0058355 A1 | 3/2012 | Lee et al. |
| 2012/0088066 A1 | 4/2012 | Aytug et al. |
| 2013/0157008 A1 | 6/2013 | Aytug et al. |
| 2013/0236695 A1 | 9/2013 | Aytug et al. |

FOREIGN PATENT DOCUMENTS

| | | |
|---|---|---|
| DE | 19740964 | 3/1999 |
| DE | 10138036 | 2/2003 |
| EP | 0718897 | 6/1996 |
| EP | 0927748 | 7/1999 |
| EP | 0985392 | 3/2000 |
| EP | 1844863 | 10/2007 |
| EP | 2011817 | 1/2009 |
| EP | 2019120 | 1/2009 |
| EP | 2286991 | 2/2011 |
| EP | 2091492 | 9/2011 |
| JP | 1065718 | 3/1987 |
| JP | 1100816 | 4/1989 |
| JP | 1100817 | 4/1989 |
| JP | 1220307 | 9/1989 |
| JP | 11025772 | 1/1999 |
| JP | 2000144116 | 5/2000 |
| JP | 2001207123 | 7/2001 |
| JP | 2003286196 | 10/2003 |
| JP | 2010510338 | 4/2010 |
| RU | 2008136478 | 3/2010 |
| WO | 02098562 | 12/2002 |
| WO | 2004048450 | 6/2004 |
| WO | 2005091235 | 9/2005 |
| WO | 2005118501 | 12/2005 |
| WO | 2007092746 | 8/2007 |
| WO | 2008045022 | 4/2008 |
| WO | 2008063134 | 5/2008 |
| WO | 2008108606 | 9/2008 |
| WO | 2009029979 | 3/2009 |
| WO | 2009118552 | 10/2009 |
| WO | 2009125202 | 10/2009 |
| WO | 2009158046 | 12/2009 |
| WO | 2010000493 | 1/2010 |
| WO | 2010038046 | 4/2010 |
| WO | 2010042555 | 4/2010 |
| WO | 2010059833 | 5/2010 |
| WO | 2010147942 | 12/2010 |
| WO | 2011022678 | 2/2011 |
| WO | 2011034678 | 3/2011 |
| WO | 2011070371 | 6/2011 |
| WO | 2011084811 | 7/2011 |
| WO | 2011109302 | 9/2011 |
| WO | 2011156095 | 12/2011 |
| WO | 2011163556 | 12/2011 |
| WO | 2012011142 | 1/2012 |
| WO | 2012012441 | 1/2012 |
| WO | 2012024005 | 2/2012 |
| WO | 2012044522 | 4/2012 |
| WO | 2012054039 | 4/2012 |

OTHER PUBLICATIONS

Arkles, "Hydrophobocity, hydrophilicity and silane surface modification", Gelest, Inc. (2006): 1-19.

Barabash, "Spatially resolved distribution of dislocations and crystallographic tilts in GaN layers grown on Si(111) substrates by maskless cantilever epitaxy", J Appl Phys (2006) 100(5): 053103. (12 pages).

Fang et al., "Formation of the superhydrophobic boehmite film on glass substrate by sol-gel method", Frontiers of Chemical Engineering in China (2009) 3(1): 97-101.

He et al., "Preparation of porous and nonporous silica nanofilms from aqueous sodium silicate", Chem Mater (2003) 15(17): 3308-3313.

Kim et al., "Critical thickness of GaN thin films on sapphire (0001)", Appl Phys Lett (1996) 69(16): 2358-2360.

(56) References Cited

OTHER PUBLICATIONS

Lai et al., "Recent progress on the superhydrophobic surfaces with special adhesion: From natural to biomimetic to functional", Journal of Nanoengineering and Nanomanufacturing (2011) 1: 18-34.

Laugel et al., "Nanocomposite silica/polyamine films prepared by a reactive layer-by-layer deposition", Langmuir (2007) 23(7): 3706-3711.

Li et al., "A facile layer-by-layer deposition process for the fabrication of highly transparent superhydrophobic coatings", Chem Commun (2009) 2730-2732.

Lin et al., "Superhydrophobic/superhydrophilic patterning and superhydrophobic-superhydrophilic gradient on the surface of a transparent silica nanoparticulate thin film", (Jun. 6, 2009). (abstract only).

Non Final Office Action mailed Dec. 3, 2009 in parent U.S. Appl. No. 11/749,852 (19 pages).

Poco et al., "Synthesis of high porosity, monolithic alumina aerogels", J Non-Crystalline Solids (2001) 285: 57-63.

Roach et al., "Progress in superhydrophobic surface development", Soft Matter (2008) 4: 224-240.

Smirnova, "Synthesis of silica aerogels and their application as a drug delivery system", Dissertation, Technischen Universitat Berlin (2002): 43-44.

Zhang et al., "Comparison of X-ray diffraction methods for determination of the critical layer thickness for dislocation multiplication", Journal of Electronic Materials (1999) 28(5): 553-558.

Zhang et al., "Mechanically stable antireflection and antifogging coating fabricated by the layer-by-layer deposition process and postcalcination", Langmuir (2008) 24(19): 10851-10857.

Feng et al., "A super-hydrophobic and super-oleophilic coating mesh film for the separation of oil and water", Angew. Chem. Int. Ed. (2004) 43: 2012-2014.

Levkin et al., "Porous polymer coatings: A versatile approach to superhydrophobic surfaces", Adv. Funct. Mater. (2009) 19: 1993-1998.

Li et al., "Joining of pressureless sintered SiC using polysiloxane SR355 with active additive Ni nanopowder", Acta Materiae Composite Sinica (2008) 25(6): 72-76. (abstract only).

Li et al., "Preparation and structure characterization of organic-inorganic nanocomposites", J. Xi'An Shiyou Univ. (Natural Sci. Ed.) Mar. 2008. (abstract only).

Tu et al., "Fabrication of superhydrophobic and superoleophilic polystyrene surfaces by a facile one step method", Macromol. Rapid Commun. (2007) 28: 2262-2266.

Wei et al., "Preparation and characterization of periodic mesoporous organosilica terminally functionalized with fluorocarbon groups by a direct synthesis", Sol-Gel Sci Technol (2007) 44: 105-110.

Ahn et al., "Heterogeneous Three-Dimensional Electronics by Use of Printed Semiconductor Nanomaterials," Science vol. 314, (2006) pp. 1754-1757.

Aytug et al., "Enhanced flux pinning in MOCVD-YBCO films through Zr additions: systematic feasibility studies," Superconductor Science and Technology, vol. 23, (2010), pp. 1-7.

Aytug et al., "Enhancement of Flux Pinning in $YBa_2Cu_3O_{7-\delta}$ Films via Nano-Scale Modifications of Substrate Surfaces," Oak Ridge National Laboratory, Oak Ridge, TN 37831, ISBN: 978-1-60021-692-3, pp. 237-262.

Aytug et al., "ORNL-Superpower CRADA: Development of MOCVD-based IBAD-2G wires" 2008, Retrieved from URL: http://111.htspeereview.com /2008/pdfs/presentations/wednesday/2G/5_2g_ornl_superpower.pdf.

Aytug, "Deposition studies and coordinated characterization of MOCVD YBCO films on IBAD-MgO templates," Superconductor Science and Technology, vol. 22, (2009) p. 1.

Chen et al., "Metal Organic Chemical Vapor Deposition for the Fabrication of YBCO Superconducting Tapes," SuperPower Inc., Schenectady, NY 12304, ISBN: 978-1-60021-692-1, pp. 205-216.

Comini et al., "Quasi-one dimensional metal oxide semiconductors; Preparation, characterization and application as chemical sensors," Progress in Materials Science, vol. 54, No. 1 (2009) pp. 1-67.

Das et al., Novel nonlithographic quantum wire array fabrication: Physica E—Low-Dimensional Systems and Nanostructures, Elsevier Science BV, NL LNKD- DOI:10.1016/J.Physe.2005.10.015, vol. 36, No. 2, 3 (2007), pp. 133-139.

Duan et al., "Indium phosphide nanowires as building blocks for nanoscale electronic and optoelectronic devices," Optoelectronic Devices, Nature, vol. 409, (2001) pp. 66-69.

Gao, et al., Single and Binary Rare Earth $REBa_2Cu_3O_{7-\delta}$ Thin Films Prepared by Chemical Solution Deposition, J. Phys. Conf. Series, vol. 97, (2008) pp. 1-5.

Goyal et al., "Irradiation-free, columnar defects comprised of self-assembled nanodots and nanorods resulting in strongly enhanced flux-pinning in $YBa_2Cu_3O_{7-\delta}$ films," Superconductor Science and Technology, vol. 18, No. 11, (2005) pp. 1533-1538.

Goyal et al., "Self-assembled, ferromagnetic Co/YSZ nanocomposite films for ultrahigh density storage media," Abstract Submitted.

Han et al., "Transition Metal Oxide Core-Shell Nanowires: Generic Synthesis and Transport Studies," Nano Letters, vol. 4, No. 7, (2004) pp. 1241-1246.

Harrington et al., "Self-assembled, rare earth tantalite pyrochlore nanoparticles for superior flux pinning in $YBa_2Cu_3O_{7-\delta}$ films," Superconductor Science and Technology, Issue 2 (2009), pp. 1-5.

Haugan et al., "In-Situ Approach to Introduce Flux Pinning in YBCO," Air Force Research Laboratory, ISBN: 978-1-60021-692-3, pp. 59-77.

Hikichi et al., "Property and Structure of $YBa_2Cu_3O_{7-x}$-$Nb_2O_5$ Composite," Journal of Applied Physics, vol. 31, (1992) L1234, Col. 2 Paragraph 1.

Huang et al., "Room-Temperature Ultraviolet Nanowire Nanolasers," Science, vol. 292, (2001) pp. 1897-1899.

Javey et al., "Layer-by-Layer Assembly of Nanowires fore Three-Dimensional, Multifunctional Electronics," Nano Letters, vol. 7, No. 3 (2007) pp. 773-777.

Kang et al., "High-Performance High-$T_c$ Superconducting Wires," Science, DOI:10.1126/Science.1124872, vol. 331, No. 31 (2006), pp. 1911-SOM.

Kang et al., "Supporting material: High-performance H-$T_c$ Superconducting Wires," Science, vol. 331 (2006) 2 pp., col. 1, paragraph 3.

Kar et al., "Synthesis and Characterization of One-dimensional MgO Nanostructures," J. Nanosci. Nanotech, vol. 314, (2006) pp. 1447-1452.

Kita et al., "Effect of $Ta_2O_5$ addition on the superconducting properties of $REBa_2CU_3O_y$," Physica C: vol. 445-448, (2006) pp. 391-394.

Kuchibhatla et al., "One dimensional nanostructured materials," Progress in Materials Science, Pergamon Press, GB-LNKD DOI: 10.1016/J.Pmatsci.2006.08.001, vol. 52, No. 5 (2007) pp. 699-913.

Le et al., Systematic studies of the epitaxial growth of single-crystal ZnO nanorods on GaN using hydrothermal synthesis,: Journal of Crystal Growth, Elsevier, Amsterdam, NL LNKD-DOI:10.1016/J.Jcrysgro.2006.04.082, vol. 293, No. 1 (2006) pp. 36-42.

Lei et al., "Highly ordered nanostructures with tunable size, shape and properties: A new way to surface non-pattering using ultra-thin alumina masks," Progress in Materials Science, Pergamon Press, GB LNKD-DOI: 10.1016/J.Pmatsci.2006.07.002, vol. 52, No. 4 (2007) pp. 465-539.

Liang et al., "Preparation of Free-Standing Nanowire Arrays on Conductive Substrates," J. Am. Chem. Soc. vol. 126 (2004) pp. 16338-16339.

Lu et al., "Quasi-one-dimensional metal oxide materials-Synthesis, properties and applications," Materials Science and Engineering R: Reports, Elsevier Sequoia S.A., Lausanne, Ch Lnkddoi:10.1016/J.Mser.2006.04.002, vol. 52, No. 103, (2006) pp. 49-91.

Ma et al., "Growth and properties of YBCO-coated conductors fabricated by inclined-substrate deposition," IEE Transactions on Applied Superconductivity, vol. 15, No. 2 (2005) pp. 2970-2973.

McIntyre et al., "Metalorganic deposition of high-$J_c$$Ba_2YCu_3O_{7-x}$ thin films from trifluoroacetate precursors onto (100) $SrTiO_3$," Journal of Applied Physics, vol. 68, No. 8 (1990) pp. 4183-4187.

Morales et al. "A laser Ablation Method for the Synthesis of Crystalline Semiconductor Nanowires," Science, vol. 279 (1998) pp. 208-211.

(56) References Cited

OTHER PUBLICATIONS

Nagashima et al., "Epitaxial Growth of MgO Nanowires by Pulsed Laser Deposition," J. Appl. Phys., vol. 101 (2007) pp. 124304-1 to 124304-4.

Pan et al., "Nanobelts of Semiconducting Oxides," Science, vol. 291, (2001) pp. 1947-1949.

Paranthaman et al., "Flux Pinning and AC Loss in Second Generation High Temperature Superconductor Wires," Oak Ridge National Laboratory, Oak Ridge, TN 37832, ISBN: 978-1-60021-692-3, pp. 3-10.

Pomar et al., "Enhanced vortex pinning in YBCO coated conductors with BZO nanoparticles from chemical solution deposition," IEEE Transactions on Applied Superconductivity, vol. 19, No. 3, (2009) pp. 3258-3261.

Saylor et al., "Experimental Method for Determining surface Energy Anisotropy and its Application to Magnesia," Journal of the American Ceramic Society, vol. 83, No. 5, (2004) pp. 1226-1232.

Selvamanickam et al., "High-current Y-Ba-Cu-O coated conductor using metal organic chemical-vapor Deposition, and ion-beam-assisted deposition," IEEE Transactions on Applied Superconductivity, vol. 11, No. 1 (2001) pp. 3379-3381.

Su et al., "Fabrication of thin films of multi-oxides ($YBa_2Cu_3O_{7-\delta}$) starting from nanoparticles of mixed ions," Superconductor Science and Technology, vol. 19, No. 11, (2006) pp. L51-L54.

Wang et al., "Growth of Nanowires," Mater. Sci. & Eng., vol. 60, No. 1-6 (2008) pp. 1-51.

Wee et al., "Enhanced flux pinning and critical current density via incorporation of self-assembled rare-earth barium tantalite nanocolumns with $YBa_2Cu_3O_{7-\delta}$ films," Physical Review B., vol. 81, No. 14 (2010) pp. 140503/1-14053/2.

Wee et al., "Formation of Self-Assembled, Double Perovskite, $Ba_2YNbO_6$ Nanocolumns and Their Contribution to Flux-Pinning and $J_c$ in Nb-Doped $YBa_2Cu_3O_{7-\delta}$ Films," Applied Physics Express, vol. 3, Issue 2, (2010) pp. 023101-023101-3.

Wee et al., "High Performance Superconducting Wire in High Applied Magnetic Fields via Nanoscale Defect Engineering," Superconductor Science and Technology, (2008) pp. 1-4.

Yamada et al., Reel-to-Reel Pulsed Laser Deposition of YBCO Thick Films, Nagoya Coated Conductor Center, Superconductivity Research Laboratory, ISTEC, 2-4—1, Mutsuno, Atsuta-ku, Nagoya, 456,-8587-Japan.

Yamada et al., "Towards the practical PLD-IBAD coated conductor fabrication—Long wire, high production rate and $J_c$ enhancement in a magnetic field," Physica C: vol. 445-448 (2006) pp. 504-508.

Yoo et al., "Electrocatalytic application of a vertical Au nanorod array using ultrathin Pt/Ru/Pt layer-by-layer coatings," Electrochimica ACTA, vol. 53, No. 1-3 (2007) pp. 3656-3662.

"Covalent Bond", Free Dictionary (Sep 27, 2013), (1 page).

Dupont, "Teflon being Oleophobic", Nov. 28, 2005, (3 pages).

Non Final Office Action mailed on Dec. 20, 2013 in U.S. Appl. No. 13/873,282, (29 pages).

Non Final Office Action mailed on Oct. 4, 2013 in U.S. Appl. No. 13/767,244, (23 pages).

\* cited by examiner

SUPERHYDROPHOBIC TRANSPARENT GLASS (STG) THIN FILM ARTICLES

CROSS-REFERENCE TO RELATED APPLICATIONS

The application is a continuation-in-part of U.S. application Ser. No. 12/901,072, "Superoleophilic Particles and Coatings and Methods of Making the Same," filed Oct. 8, 2010, the entirety of which is incorporated herein by reference

FIELD OF THE INVENTION

The present invention relates to articles with optically transparent, nanostructured hydrophobic or super-hydrophobic surfaces.

BACKGROUND OF THE INVENTION

There are abundant uses for superhydrophobic materials, including self-cleaning surfaces, anti-fouling surfaces and anti-corrosion surfaces. Approaches for producing surfaces exhibiting these properties include producing microtextured superhydrophobic surfaces or chemically active antimicrobial surfaces. Despite the impressive properties achieved by such known surfaces, the properties are not durable and the surfaces need to be replaced or otherwise maintained frequently. Thus, research to identify alternative approaches has continued.

SUMMARY OF THE INVENTION

The invention includes an article having a nanostructured surface. The article can include a substrate and a nanostructured layer bonded to the substrate. The nanostructured layer can be directly bonded to the substrate, i.e., without any adhesive or intermediary layers. The nanostructured layer can be atomically bonded to the substrate. The nanostructured layer can include a plurality of spaced apart nanostructured features comprising a contiguous, protrusive material. The nanostructured layer can include an oil pinned in a plurality of nanopores formed by a plurality of nanostructured features.

The nanostructured features can be sufficiently small so that the nanostructured layer is optically transparent. The width, length and height of each of said plurality of spaced apart nanostructured features ranges from 1 to 500 nm.

A continuous hydrophobic coating can be disposed on the plurality of spaced apart nanostructured features. The continuous hydrophobic coating can include a self-assembled monolayer.

The plurality of spaced apart nanostructured features provide an anti-reflective surface. The plurality of spaced apart nanostructures features can provide an effective refractive index gradient such that the effective refractive index increases monotonically towards the substrate.

A method of forming the article with a nanostructured surface layer is also described. The method can include providing a substrate; depositing a film on the substrate; decomposing the film to form a decomposed film; and etching the decomposed film to form the nanostructured layer.

The decomposition step can be performed under a non-oxidizing atmosphere. The decomposing step can include heating the film to a sufficient temperature for a sufficient time to produce a nanoscale spinodal decomposition.

The method can also include applying a continuous hydrophobic coating to the plurality of spaced apart nanostructured features, pinning an oil within nanopores formed by the plurality of nanostructured features, or both.

BRIEF DESCRIPTION OF THE DRAWINGS

A fuller understanding of the present invention and the features and benefits thereof will be obtained upon review of the following detailed description together with the accompanying drawings, in which.

DETAILED DESCRIPTION OF THE INVENTION

Figure 1:
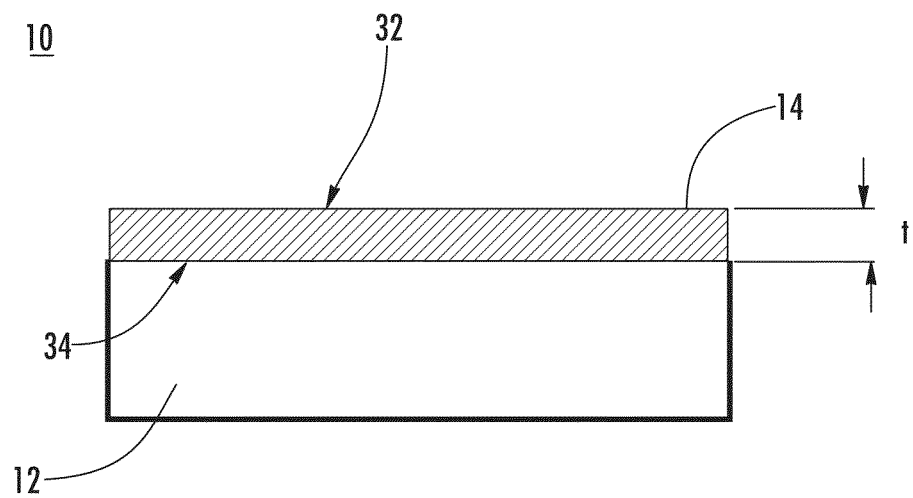
FIG. 1 is a schematic cross-section of an article with a nanostructured layer.

A substrate including a superhydrophobic transparent glass thin film and method of making the same are described. The glass thin film is applied in such a manner that it is possible to deposit thin films on a variety of substrates. The glass thin film can be superhydrophobic, self-cleaning, anti-reflective across the visible light spectrum, the IR spectrum, or both, while blocking, i.e., reflecting or scattering, UV radiation.

As shown in the Figures, the articles 10 with nanostructures surfaces described herein can include a substrate 12 and a nanostructured layer 14 attached to the substrate 12. The nanostructured layer 14 can include a plurality of spaced apart nanostructured features 16 comprising a contiguous, protrusive material 18 and the nanostructured features 16 can be sufficiently small that the nanostructured layer 14 is optically transparent. The nanostructured layer 14 can include a plurality of nanopores 20 defined by the contiguous, protrusive material 18, e.g., the nanostructured features 16.

As used herein, "optically transparent" refers to a material or layer that transmits rays of visible light in such a way that the human eye may see through the glass distinctly. One definition of optically transparent is a maximum of 50% attenuation at a wavelength of 550 nm (green light) for a material or layer, e.g., a layer 1 μm thick. Another definition can be based on the Strehl Ratio, which ranges from 0 to 1, with 1 being a perfectly transparent material. Exemplary optically transparent materials can have a Strehl Ratio≥0.5, or a Strehl Ratio≥0.6, or a Strehl Ratio≥0.7, or a Strehl Ratio≥0.8, or a Strehl Ratio≥0.9, or a Strehl Ratio≥0.95, or a Strehl Ratio≥0.975, or a Strehl Ratio≥0.99.

As used herein, the term "nanopores" refers to pores with a major diameter ranging from 1 to 750 nm. Nanopores can also refer to pores having a major diameter ranging from 5 to 500 nm, or 10 to 400 nm, or any combination thereof, e.g., 400 to 750 nm. The nanostructured layer described herein can have a nanopore size ranging from 10 nm to about 10 μm, or 100 nm to 8 μm, or 500 nm to 6 μm, or 1 to 5 μm, or any combination thereof, e.g., 500 nm to 5 μm.

The nanostructures features formed from a contiguous, protrusive material described herein can be formed by differentially etching of spinodally decomposed materials as described in U.S. Pat. No. 7,258,731, "Composite, Nanostructured, Super-Hydrophobic Material", issued to D'Urso et al., on Aug. 21, 2007; U.S. Patent Application Publication No. 2008/0286556, "Super-Hydrophobic Water Repellant Powder," published Nov. 20, 2008; and U.S. patent application Ser. No. 12/901,072, "Superoleophilic Particles and Coatings and Methods of Making the Same," (hereinafter "Differential Etching References") filed Oct. 8, 2010, the entireties of which are incorporated by reference herein.

Figure 3:
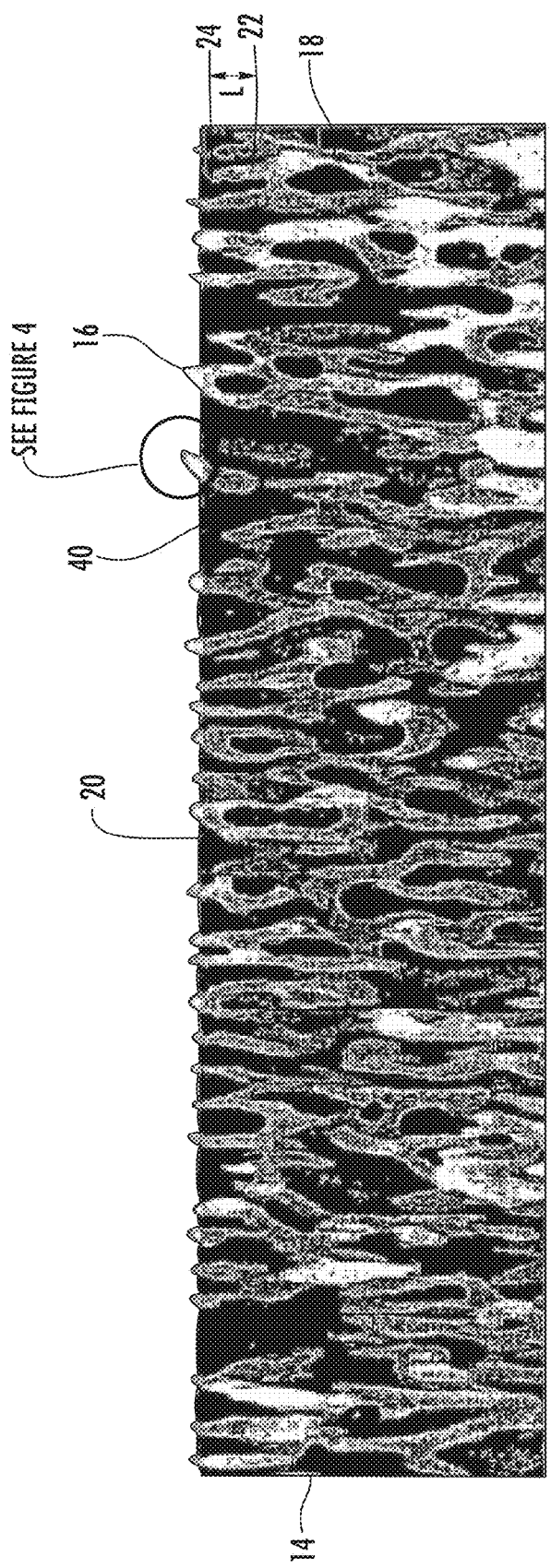
FIG. 3 is a schematic cross-section of a nanostructured layer with oil pinned within the nanopores of the nanostructured layers.
Figure 5:
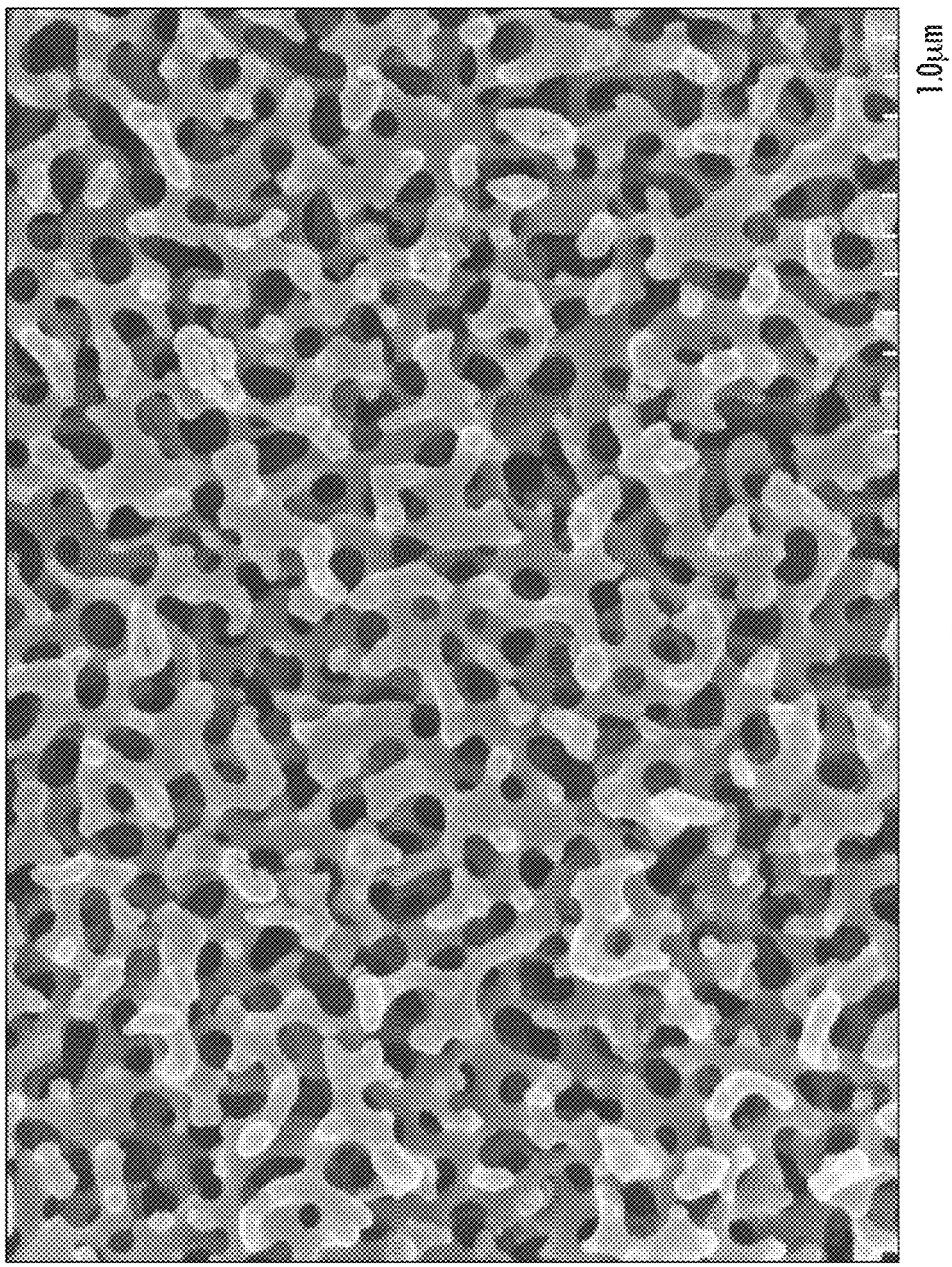
FIG. 5 is an SEM image of nanostructured features as described herein (1 micron scale).
Figure 6:
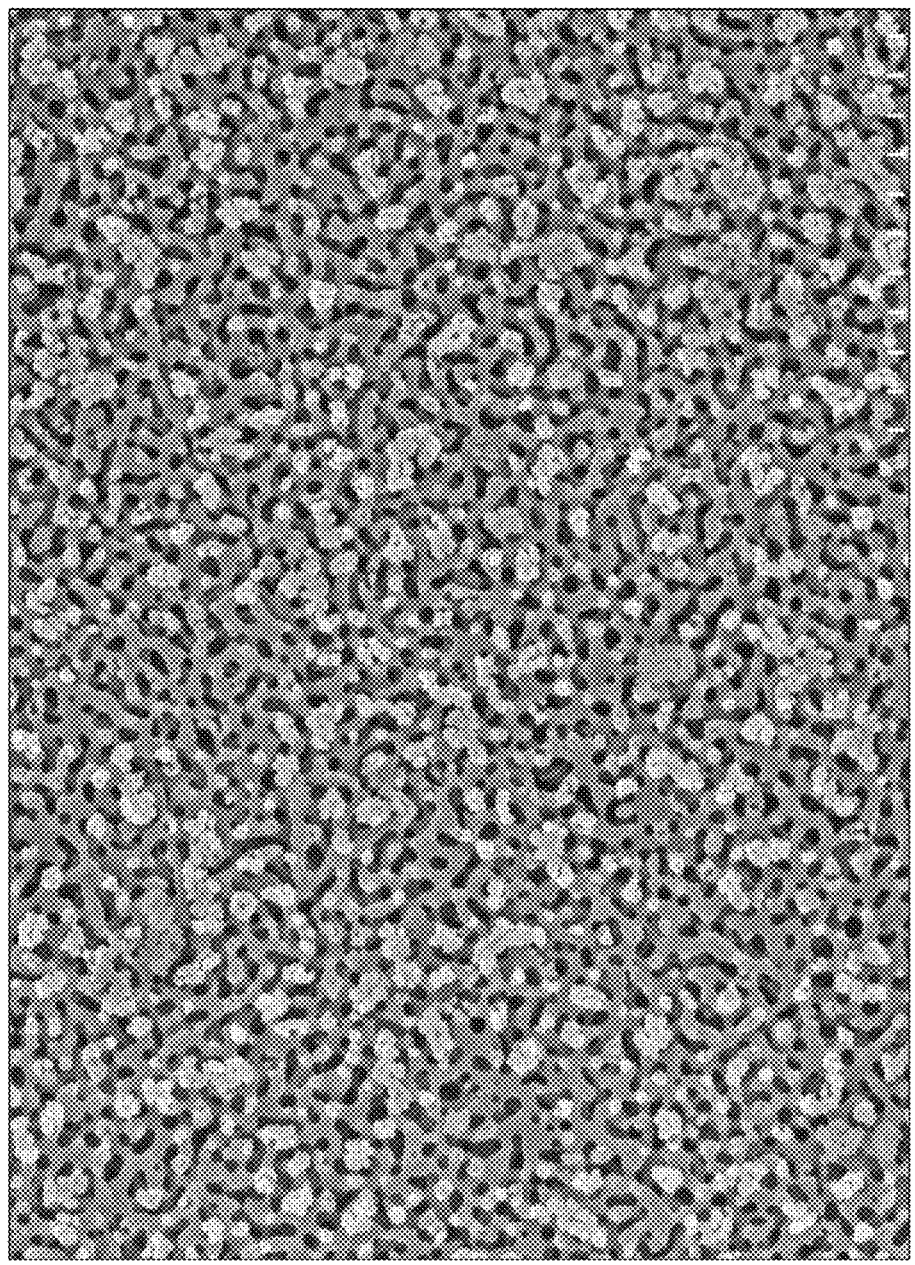
FIG. 6 is an SEM image of nanostructured features as described herein (2 micron scale).

As used herein, nanostructured feature has its literal meaning and includes, but is not limited to, nanoscale protrusions and nanoscale branched networks. As used herein, "nanoscale branched network" refers to a branched network where the individual branches are less than 1 µm. In some examples, the branches of the nanoscale branched networks described herein can be 750 nm or less in length, or 600 nm or less in length, or 500 nm or less in length. A branch can be defined by the space (i) between adjacent junctions 22, (ii) between a junction 22 and a terminal end 24 of the network, i.e., a nanoscale protrusion, or (iii) both. As shown in FIG. 3, the length (L) of a branch can be measured as the distance (i) between adjacent junctions 22, (ii) between a junction 22 and a terminal end 24 of the network, i.e., a nanoscale protrusion, or (iii) both. Though not a nanoscale branched network, staghorn coral (*A. cervicornis*) would be considered an exemplary branched network. In addition, FIGS. 5 & 6 show an SEM image of an exemplary nanoscale branched network formed by differential etching of a specially treated spinodally decomposed glass substrate.

The width, length and height of each of the plurality of spaced apart nanostructured features 16 can independently range from 1 to 500 nm, or from 2 to 400, or from 3 to 300 nm, or from 4 to 250 nm, or from 5 to 200 nm, or any combination of these ranges, e.g., 1 to 200 nm. The width, length and height of each of the plurality of spaced apart nanostructures features can be at least 5 nm, at least 7 nm, at least 10 nm, or at least 20 nm.

The nanostructured layer 14 can also include an etching residue disposed on the contiguous, protrusive material. As will be understood, the etching residue can result from the differential etching process utilized to remove the boron-rich phase of a spinodally decomposed borosilicate layer 26, which is an intermediate product of the spinodal decomposition described in the Differential Etching References referenced above. Thus, the etching residue can include remnants of the recessive contiguous material that was interpenetrating with the protruding material in the spinodally decomposed film 26 intermediary. The etching residue can be contiguous or non-contiguous.

The formation of the nanostructured layer 14 can include an intermediate spinodally decomposed glass film 26 formed from a film 28 selected from the group that includes, but is not limited to, a sodium borosilicate glass and a soda lime glass. An exemplary sodium borosilicate glass can include 65.9 wt-% $SiO_2$, 26.3 wt-% $B_2O_3$ and 7.8 wt-% $Na_2O$. The soda lime glass can be any soda lime glass that can be spinodally decomposed and etched to form the nanostructured layer described herein. The protrusive material (e.g., silica-rich phase), the recessive material (e.g., alkali and/or borate-rich phase) or both can be glass.

The contiguous, protrusive material can be directly bonded to the substrate 12. In some exemplary articles, the contiguous, protrusive material can be atomically, i.e., covalently, bonded to the substrate 12. For example, where the substrate 12 is a silica-rich glass and the nanostructured layer 14 is formed from differential etching of a spinodally decomposed sodium borosilicate glass 26, the silica-rich contiguous, protrusive phase of the nanostructured layer 14 can be covalently bonded to the substrate 12. In fact, in some cases, the composition of the substrate 12 and the contiguous, protrusive phase of the nanostructured layer 14 can be the same. This can result in a structure where there is no clear interfacial delineation between the nanostructured layer 14 and the substrate 12.

In some other examples, the contiguous, protrusive material of the nanostructured layer 14 can be directly bonded to the surface 30 of the substrate 12 by a means other than covalent bonding. In other words, the bond between the substrate 12 and the contiguous, protrusive material 18 can be formed directly without reliance on an adhesive or interfacial material to join the contiguous, protrusive material 18 to the surface 30 of the substrate 12. Such a process could involve interfacial atomic or molecular interdiffusion due to high impact velocities or temperature of deposited species. For example, during physical vapor deposition, target source species arrive at the substrate with high kinetic energy and with various angles of incidence. Because of this, highly dense films with exceptional adherence and coverage can be obtained, even on irregular surfaces. This direct bonding can result from the method of deposition of the precursor to the nanostructured layer, e.g., a physical or chemical vapor deposition technique.

The plurality of spaced apart nanostructured features 16 can cause the nanostructured layer 14 to exhibit anti-reflective properties. In some examples, the plurality of spaced apart nanostructures features can produce an effective refractive index gradient, wherein the effective refractive index gradient increases monotonically towards the surface of the substrate.

Optical glass ordinarily reflects about 4% of incident visible light. The nanostructured layers 14 described herein can provide anti-reflective properties in addition to hydrophobic and transparent properties. As used herein, anti-reflective refers to <1% reflection, and preferably <0.1% for normally incident visible light (e.g., wavelengths from approximately 380-750 nm).

The nanostructured layer 14 described herein in general will have two "interfaces," i.e., an air-layer interface 32 and a layer-substrate interface 34, and a thickness (t). If the nanostructured layer has optically small features (<200 nm features) that are homogeneously distributed throughout the layer, then interfaces 32, 34 will reflect a certain amount of light. If the air-layer reflection 32 returns to the surface 30 such that it is of equal amplitude and out of phase with the layer-substrate interface reflection 34, the two reflections completely cancel (destructive interference) and the nanostructured layer 14 will be antireflective for that wavelength. The thickness (t) of the nanostructured layer 14 determines the reflected phase relationships while the optical indexes of refraction determine the reflective amplitudes.

In order to exhibit anti-reflective properties, the length (L) of the nanostructured features 16 is preferably about ¼ of the wavelength (λ/4) of the relevant light, such as about 140 nm for green light, which has a wavelength range of approximately 495-570 nm. The nanostructured layer 14 can have an effective optical index of refraction and its thickness (t) can be adjusted by the etch duration to obtain the correct thickness to produce an antireflective surface. For example, for a nanostructured layer 14 formed from sodium borosilicate glass, the refractive index to provide anti-reflectivity should be on the order of $[(nf_{air}+nf_{glass})/(nf_{glass}-nf_{air})]^{1/2}$=about 1.22 for a $nf_{glass}$=1.5.

Alternately, the use of diffusion limited differential etching of the spinodally decomposed nanostructured layer can be used to produce a variable porosity graded index of refraction layer 14. Finally, an anti-reflective surface can be created by applying a coating that provides a graded index of refraction. The nanostructured layer 14 will generally have an effective reflective index gradient.

In some examples, with increasing duration of etching there will be little or no etching of the decomposed layer 26 at the layer-substrate interface 34, while preferably, the porosity of the nanostructures layer 14 increases greatly approaching the layer-air interface 32. In fact, the porosity and resulting layer index of refraction would approach that of air (~1.01) near the layer-air interface 32. This reflective index gradient can provide broad spectrum anti-reflective properties. As used herein, "broad-spectrum antireflective properties" refers to anti-reflectivity across a wavelength range of at least 150 nm of the visible and/or infrared light spectrum, at least 200 nm of the visible and/or infrared light spectrum, at least 250 nm of the visible and/or infrared light spectrum, at least 300 nm of the visible and/or infrared light spectrum, or at least 350 nm of the visible and/or infrared light spectrum. Based on the range described above, it will be understood that the visible and infrared light spectrum includes a range of 1120 nm, i.e., from 380 to 1500 nm.

Relying on the same principles, the nanostructured layer 14 can be tailored to exhibit UV blocking properties. As used herein, "UV radiation" refers to radiation with a wavelength ranging from 10-400 nm. For example, the nanostructured layer can block or reflect at least 80% of UV radiation, at least 85% of UV radiation, at least 90% of UV radiation, at least 95% of UV radiation, at least 97.5% of UV radiation, at least 99% of UV radiation, or at least 99.5% of UV radiation.

The nanostructured layer 14 can have a thickness (t) of 2000 nm or less, 1000 nm or less, or 500 nm or less. The nanostructured layer can have a thickness of at least 1 nm, at least 5 nm, at least 10 nm, at least 15 nm, or at least 20 nm.

The nanostructured layer 14 itself can be superhydrophobic when the surface 38 of the nanostructured features 16 are hydrophobic or are made hydrophobic, e.g., through application of a hydrophobic coating. This can be achieved by applying a fluorinated silane solution to the nanostructured layer 14 in order to create a hydrophobic monolayer on the surface 38 of the nanostructured layer 14. Accordingly, one method of making the nanostructured layer 14 superhydrophobic would be to apply a continuous hydrophobic coating 36 on a surface 38 of the plurality of spaced apart nanostructured features 16. As used herein, "superhydrophobic" refers to materials that exhibit contact angle with water of greater than 140°, greater than 150°, greater than 160°, or even greater than 170°.

The continuous hydrophobic coating 36 can be a self-assembled monolayer (SAM). As described in the referenced patent applications, the nanostructured layer 14 will be superhydrophobic only after a hydrophobic coating layer 36 is applied thereto. Prior to application of the hydrophobic coating 36, the uncoated nanostructured layer will generally be hydrophilic. The hydrophobic coating layer 36 can be a perfluorinated organic material, a self-assembled monolayer, or both. Methods and materials for applying the hydrophobic coating, whether as a self-assembled monolayer or not, are fully described in the U.S. patent applications referenced hereinabove.

Figure 4:
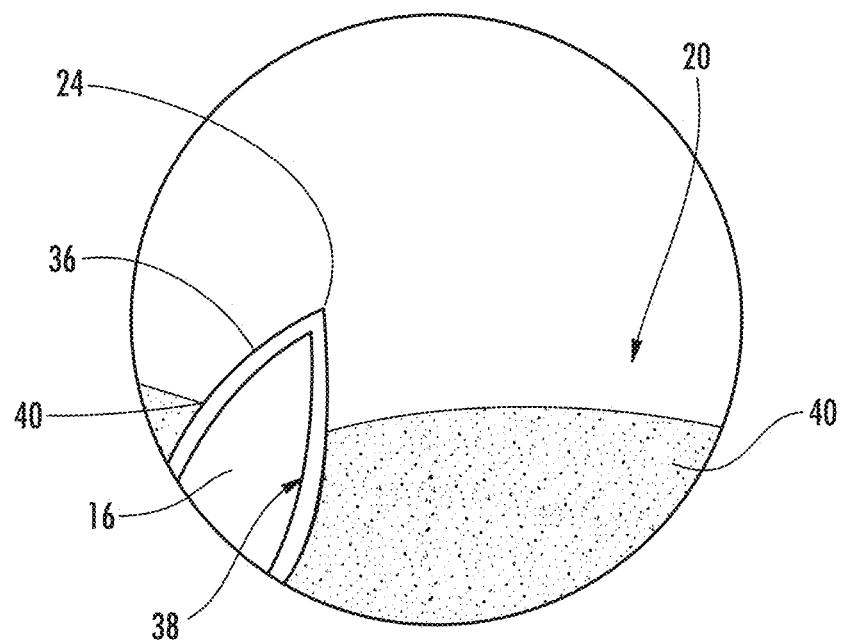
FIG. 4 is a schematic cross-section showing oil pinned within a nanopore.

As shown schematically in FIG. 4, the hydrophobic coating 36 can be continuously coated over the spaced apart nanostructured features 16. The coating 36 can be formed as a self-assembled monolayer. Self-assembled monolayers (SAMs) are coatings consisting of a single layer of molecules on a surface, such as a surface 38 of the nanostructured features 16. In a SAM, the molecules are arranged in a manner where a head group is directed toward or adhered to the surface, generally by the formation of at least one covalent bond, and a tail group is directed to the air interface to provide desired surface properties, such as hydrophobicity. As the hydrophobic tail group has the lower surface energy it dominates the air-surface interface providing a continuous surface of the tail groups.

Although SAM methods are described, it will be understood that alternate surface treatment techniques can be used. Additional exemplary surface treatment techniques include, but are not limited to, SAM; physical vapor deposition, e.g., sputtering, pulsed laser deposition, e-beam co-evaporation, and molecular beam epitaxy; chemical vapor deposition; and alternate chemical solution techniques.

SAMs useful in the instant invention can be prepared by adding a melt or solution of the desired SAM precursor onto the nanostructured layer 14 where a sufficient concentration of SAM precursor is present to produce a continuous conformal monolayer coating 36. After the hydrophobic SAM is formed and fixed to the surface 38 of the nanostructured layer 14, any excess precursor can be removed as a volatile or by washing. In this manner the SAM-air interface can be primarily or exclusively dominated by the hydrophobic moiety.

One example of a SAM precursor that can be useful for the compositions and methods described herein is tridecafluoro-1,1,2,2-tetrahydroctyltriclorosilane. In some instances, this molecule undergoes condensation with the silanol groups of the nanostructured layer, which releases HCl and covalently bonds the tridecafluoro-1,1,2,2-tetrahydroctylsilyls group to the silanols at the surface of the porous particle. The tridecafluorohexyl moiety of the tridecafluoro-1,1,2,2-tetrahydroctylsilyl groups attached to the surface of the nanostructured layer provides a monomolecular layer that has a hydrophobicity similar to polytetrafluoroethylene. Thus, such SAMs make it possible to produce a nanostructured layer 14 having hydrophobic surfaces while retaining the desired nanostructured morphology that produces the desired superhydrophobic properties.

A non-exclusive list of exemplary SAM precursors that can be used for various embodiments of the invention is:

$X_y(CH_3)_{(3-y)}SiLR$ where y=1 to 3; X is Cl, Br, I, H, HO, R'HN, R'$_2$N, imidizolo, R'C(O)N(H), R'C(O)N(R"), R'O, F$_3$CC(O)N(H), F$_3$CC(O)N(CH$_3$), or F$_3$S(O)$_2$O, where R' is a straight or branched chain hydrocarbon of 1 to 4 carbons and R" is methyl or ethyl; L, a linking group, is CH$_2$CH$_2$, CH$_2$CH$_2$CH$_2$, CH$_2$CH$_2$O, CH$_2$CH$_2$CH$_2$O, CH$_2$CH$_2$C(O), CH$_2$CH$_2$CH$_2$C(O), CH$_2$CH$_2$OCH$_2$, CH$_2$CH$_2$CH$_2$OCH$_2$; and R is (CF$_2$)$_n$CF$_3$ or (CF(CF$_3$)OCF$_2$)$_n$CF$_2$CF$_3$, where n is 0 to 24. Preferred SAM precursors have y=3 and are commonly referred to as silane coupling agents. These SAM precursors can attach to multiple OH groups on the surface and can link together with the consumption of water, either residual on the surface, formed by condensation with the surface, or added before, during or after the deposition of the SAM precursor. All SAM precursors yield a most thermodynamically stable structure where the hydrophobic moiety of the molecule is extended from the surface and establish normal conformational populations which permit the hydrophobic moiety of the SAM to dominate the air interface. In general, the hydrophobicity of the SAM surface increases with the value of n for the hydrophobic moiety, although in most cases sufficiently high hydrophobic properties are achieved when n is about 4 or greater where the SAM air interface is dominated by the hydrophobic moiety. The precursor can be a single molecule or a mixture of molecules with different values of n for the perfluorinated moiety. When the precursor is a mixture of molecules it is preferable that the molecular weight distribution is narrow, typically a Poisson distribution or a more narrow distribution.

The SAM precursor can have a non-fluorinated hydrophobic moiety as long as the SAM precursor readily conforms to the nanostructured features 16 of the nanostructured layer 14 and exhibits a sufficiently low surface energy to exhibit the desired hydrophobic properties. Although fluorinated SAM precursors may be preferred, in some embodiments of the invention silicones and hydrocarbon equivalents for the R groups of the fluorinated SAM precursors above can be used. Additional details regarding SAM precursors and methodologies can be found in the patent applications that have been incorporated herein by reference.

That article 10 can also, optionally, include an oil 40 pinned in the plurality of nanopores 20 formed by the plurality of nanostructured features 16. The oil 40 pinned by and/or within the nanopores 20 can be a non-nutritional oil. As used herein, the term "non-nutritional" is used to refer to oils that are not consumed as a nutrient source by microbes, e.g., bacteria, fungus, etc., or other living organisms. Exemplary non-nutritional oils include, but are not limited to polysiloxanes.

As used herein, "pinned" refers to being held in place by surface tension forces, van der Waal forces (e.g., suction), or combinations of both. For example, the interactions that prevent a liquid from being dispensed from a laboratory pipette until the plunger is depressed could be referred to as pinning.

As used herein, "oil" is intended to refer to a non-polar fluid that is a stable, non-volatile, liquid at room temperature, e.g., 23-28° C. The oils used herein should be incompressible and have no solubility or only trace solubility in water, e.g., a solubility of 0.01 g/l or 0.001 g/l or less. Exemplary oils include non-volatile linear and branched alkanes, alkenes and alkynes, esters of linear and branched alkanes, alkenes and alkynes; polysiloxanes, and combinations thereof.

The oil 40 can be pinned in all or substantially all of the nanopores and/or surface nanopores of the nanostructured layer 14. For example, oil 40 can be pinned in at least 70%, at least 80%, at least 90%, at least 95%, at least 97.5%, or at least 99% of the nanopores and/or surface nanopores of the nanostructured layer 14 described herein. The oil 40 pinned within the nanostructured layer 14 can be a contiguous oil phase. Alternately, the superoleophilic layer 14 described herein can include an inner air phase with an oil phase at the air-nanostructured layer interface 32.

In order to maintain the superoleophilic properties for an extended duration, it can be desirable that the oil 40 pinned in the nanostructured layer 14 does not evaporate when the article 10 is exposed to the use environment. For example, the oil 40 can be an oil 40 that does not evaporate at ambient environmental conditions. An exemplary oil 40 can have a boiling point of at least 120° C., or at least 135° C., or at least 150° C. or at least 175° C.

As used herein, "ambient environmental conditions" refer generally to naturally occurring terrestrial or aquatic conditions to which superoleophilic materials may be exposed. For example, submerged in lakes, rivers and oceans around the world, and adhered to manmade structures around the world. Exemplary ambient environmental conditions include (i) a temperature range from −40° C. to 45° C. at a pressure of one atmosphere, and (ii) standard temperature and pressure.

As described above, the nanostructured layer 14 can be covalently or otherwise strongly bonded to the substrate 12. Such bonds, especially covalent bonds, are very strong and eliminate cracks that can act to concentrate stresses. In particular, this is a significant improvement over conventional adhesive bonding and allows the flexibility to bond a nanostructured layer to a compositionally different substrate without the use of an adhesive. This is yet another manner in which the durability of the nanostructured layer described herein is enhanced.

Figure 2:
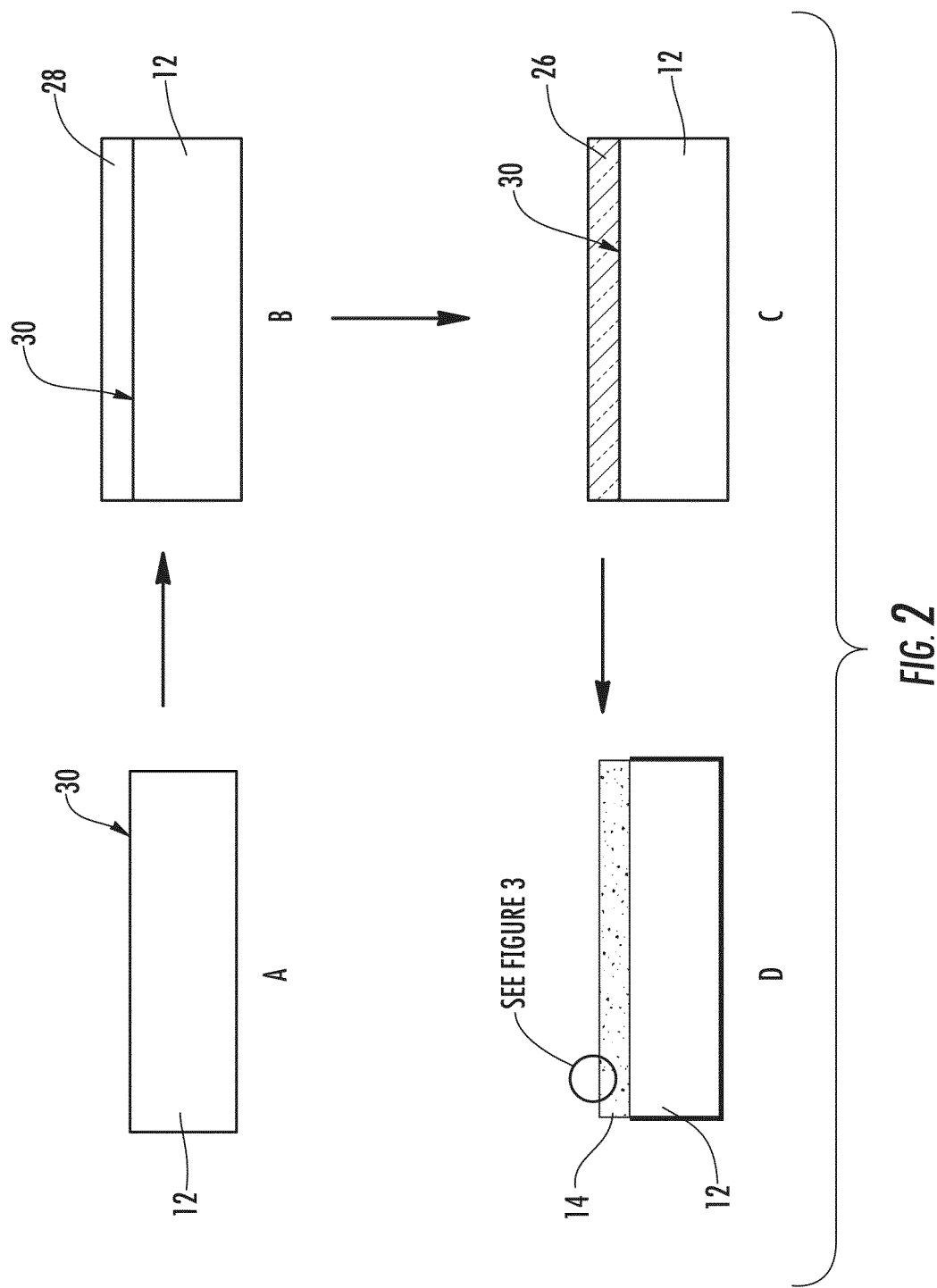
FIGS. 2A-D are schematic cross-sections of a method of making an article with a nanostructures layer.

A method of forming an article 10 with a nanostructured surface 14 is also described. As shown in FIGS. 2A-D, the method can include providing a substrate 12 (FIG. 2A); depositing a film 28 on the substrate 12 (FIG. 2B); decomposing the film 28 to form a decomposed film 26 (FIG. 2C); and etching the decomposed film 26 to form the nanostructured layer 14 (FIG. 2D). The decomposed film 26 can be a spinodally decomposed film.

In the depositing step, the film 28 can be deposited on the substrate 12 using an in-situ thin film deposition process selected from the group that includes, but is not limited to, pulsed laser ablation, chemical vapor deposition (CVD), metallorganic chemical vapor deposition (MOCVD), sputtering and e-beam co-evaporation. Alternately, the film 28 can be deposited on the substrate 12 using an ex-situ thin film deposition process selected from the group that includes, but is not limited to chemical solution processes, and deposition of a halogen compound for an ex situ film process, followed by a heat treatment. The depositing step can occur at a temperature between 15 and 800° C.

In some exemplary methods, the decomposing step can be part of the depositing step, i.e., the film 28 may be deposited in decomposed state 26. For example, by depositing the film 28 at a temperature sufficient to induce decomposition, e.g., spinodal decomposition, during the depositing step. In other exemplary methods, the decomposing step can be a separate step, such as a heating step. The decomposing step can include heating the deposited film 28 to a sufficient temperature for a sufficient time to produce a nanoscale spinodal decomposition. As used herein, "nanoscale spinodal decomposition" refers to spinodal decomposition where the protrusive and recessive interpenetrating networks are of dimensions that, upon differential etching, can result in the nanostructured layers described herein.

The decomposition step can be performed under a non-oxidizing or inert atmosphere. Exemplary inert or non-oxidizing atmospheres include Ar, $H_2$, $N_2$, and combinations thereof (e.g., Ar & $H_2$).

Exemplary decomposed films 26 include a contiguous, protrusive phase and a contiguous, recessive phase that are differentially etchable (i.e. have different etch rates), when subjected to one or more etchants and have an interconnected structure, such as a spinodal structure. The as-deposited film 28 may need to be heat treated in order to phase separate properly. The decomposed film 26 can then be differentially etched to remove most or all of the recessive phase (such as borate-rich phase in the case of borosilicate glass), and to sharpen and thin the protrusive phase to form the plurality of nanostructured features 16.

Although etching is generally described herein as being solution based, etching can also be carried out by vapor etchants. The remaining surface features 16 after etching are characterized by general nanosize dimensions (width, length, and spacing) in a range of about 4 nm to no more than 500 nm, preferably <200 nm, such as in a range of about 50 nm to no more than about 100 nm.

Nanostructured feature 16 dimensions may vary as a function of feature length if a wet etch process is used to form the nanostructured features 16. In this case, the feature dimensions at the air-layer interface 32 of the nanostructured layer 14 tends to be smallest, with the feature size increasing monotonically towards the layer-substrate interface 34, which is inherently exposed to the etchant for a shorter period of time.

An exemplary etchant is hydrogen fluoride, such as a 0.05 to 1 mol-% aqueous hydrogen fluoride solution or a 0.1 to 0.5 mol-% aqueous hydrogen fluoride solution.

The dimensions of the nanostructured features 16 are dependent on a number of factors, such as composition, heat treating duration and temperature. The nanostructured feature 16 dimensions, including height of the features, are generally determined by the etch rate and etch time selected. Compared to the processing described in the Differential Etching References cited herein, shorter heating and etch times are generally utilized to form features having dimensions <200 nm.

Smaller feature sizes (<200 nm) make the nanostructured layer 14 more optically transparent. The processing parameters are heavily dependent on the specific phase separating material used. For example, some glasses will phase separate and be spinodal from the initial glass deposition (no additional heat treating required). Other glasses require many days of specific heat treating to form a phase separated spinodal structure. This dependence on the processing parameters is applicable for other parameters as well (e.g., etchant type, etchant concentration and etch time). The degree of transparency can often be typically less than optical quality, such as a Strehl ratio<0.5, due to the imposed surface roughness (or porosity) of the features that make the surface superhydrophobic.

The method can also include applying a continuous hydrophobic coating 36 to a surface 38 of the plurality of spaced apart nanostructured features 16. The continuous hydrophobic coating 36 can be a self-assembled monolayer as described above.

The etching step can be continued until a width, length and height of each of the plurality of spaced apart nanostructured features 16 ranges from 1 to 500 nm, or can be continued until the nanostructured features 16 are any other size described herein.

The decomposed film 26 can include a first material and a second material different from the first material. The first material can be contiguous and the second material can be contiguous, and the first and second materials can form an interpenetrating structure. The first material and the second material can have differential susceptibility to an etchant, e.g., 0.5 molar HF. For example, the first material can be a protrusive phase, i.e., less susceptible to the etchant, and the second material can be a recessive phase, i.e., more susceptible to the etchant.

The first and second materials can be independently selected from the group consisting of glass, metal, ceramic, polymer, resin, and combinations thereof. The first material can be a first glass and the second material can be a second glass different from the first glass.

In some exemplary methods, the recessive phase is completely etched, while in others exemplary methods portions of the recessive phase remain. Accordingly, the nanostructured layer 14 can include an etching residue disposed on the contiguous, protrusive material, where the etching residue is from a recessive contiguous material that was interpenetrating with the protruding material in the decomposed film 26.

The method can include pinning an oil 40 within nanopores 20 formed (or defined) by the plurality of spaced apart nanostructured features 16. The pinning step can include contacting an oil pinning solution with the nanopores 20 of the nanostructured layer 14. The oil pinning solution can include the oil 40, a surfactant, or both. Exemplary surfactants include volatile alcohols, e.g., methanol, ethanol, etc.; acetone; volatile linear and branched alkanes, alkenes and alkynes, e.g., hexane, heptanes and octane; and combinations thereof.

The oil 40 being pinned should be miscible in the surfactant and the surfactant should have a viscosity that is lower than that of the oil. Because high viscosity fluids, such as some of the relevant non-volatile oils, cannot penetrate into nanopores 20, a critical feature of the surfactants is reduction of the effective viscosity of the oil pinning solution to a range that can penetrate the nanopores 20. Once the oil pinning solution penetrates the nanopores 20, the surfactant can volatize leaving the oil 40 pined within the nanopores 20.

In general, the ratio of oil-to-surfactant should be such that the viscosity of the oil pinning solution is sufficiently low to penetrate into the nanopores of the nanostructured layer 14. The oil can be 0.01 to 100 wt-% of the oil pinning solution, 0.01 to 20 wt-% of the oil pinning solution, 0.05 to 10 wt-% of the oil pinning solution or 0.1-5 wt-% of the oil pinning solution. Where the surfactant is present, the surfactant can be 99.99 to 80 wt-% of the oil pinning solution, or 99.95 to 90 wt-% of the oil pinning solution, or 99.99 to 95 wt-% of the oil pinning solution. Additional features of the exemplary materials with oil 40 pinned in the nanopores 20 of nanostructured layer 14 are provided in U.S. application Ser. No. 12/901,072, "Superoleophilic Particles and Coatings and Methods of Making the Same," filed Oct. 8, 2010, the entirety of which is incorporated herein by reference.

The present invention can be used to make a variety of articles. For example, articles can include cover plates for optical systems, windows, labware and optical detectors.

EXAMPLES

In one example, a sodium borosilicate material was sputtered onto a silicon substrate in an inert atmosphere (Ar—$H_2$). The composition of the sodium borosilibate material was 65.9 wt-% $SiO_2$, 26.3 wt-% $B_2O_3$, and 7.8 wt-% $Na_2O$. The sputtering conditions were as follows:

Base Pressure (Background pressure of the system) ~1-3× $10^{-7}$ Torr.

Sputter Pressure=$5×10^{-3}$ Torr

Sputter Temperature (Substrate Temperature)=Room temperature (~25° C.)

Sputter Power=100 Watt (but not limited to this value)

Sputter Gas=Ar

The sodium borosilicate-silicon composite was heat treated from 30 minutes at a temperature of ~700° C. in order to spinodally decompose the sodium borosilicate layer. The surface was then etched for 1 minute using 0.5 mol-% hydrogen fluoride. The resulting material was optically clear and had a layer thickness of approximately 300 nm, feature sizes of ~75 nm, and good superhydrophobicity (contact angle >170 degrees). The surface showed antireflective behavior.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A method of forming an article with a nanostructured surface layer, comprising:
   providing a substrate;
   forming a decomposed film on the substrate,
      wherein the decomposed film comprises a first material and a second material,
      wherein the first material and the second material are differentially etchable; and etching said decomposed film for an etch duration to form the nanostructured surface layer comprising a plurality of spaced apart nanostructured features comprising a contiguous, protrusive material, wherein said nanostructured layer comprises nanopores formed by said plurality of spaced apart nanostructured features, wherein the etch duration is selected
- to provide the nanostructured layer with a variable porosity,
- to provide the nanostructured layer with a graded index of refraction, and
- such that the nanostructured layer exhibits one selected from the group consisting of
  - a Strehl Ratio of from 0 to 1,
  - anti-reflectivity across a wavelength range of at least 150 nm,
  - UV blocking properties that reflect at least 80% of UV radiation, and
  - combinations thereof, wherein the nanostructured surface layer comprises a layer-substrate surface adjacent to the substrate and a layer-air surface opposing the layer-substrate surface, wherein the variable porosity comprises an increasing degree of porosity in a direction from the layer-substrate surface toward the layer-air surface, and wherein the graded index of refraction comprises a decreasing index of refraction in a direction from the layer-substrate surface toward the layer-air surface.

2. The method according to claim 1, wherein at least some of said nanopores provide a flow through porosity from a top to a bottom of said nanostructured layer.

3. The method according to claim 1, further comprising: applying a continuous hydrophobic coating to said plurality of spaced apart nanostrucutured features.

4. The method according to claim 3, wherein said continuous hydrophobic coating is a self-assembled monolayer.

5. The method according to claim 1, wherein a width, length and height of each of said plurality of spaced apart nanostructured features ranges from 1 to 500 nm.

6. The method according to claim 1, wherein forming the decomposed film on the substrate comprises depositing a film on the substrate and decomposing the film to form the decomposed film.

7. The method according to claim 1, wherein forming the decomposed film on the substrate comprises depositing a film in a decomposed state on the substrate to form the decomposed film.

8. The method according to claim 7, wherein the depositing occurs at a temperature sufficient to induce decomposition of the film.

9. The method according to claim 1, further comprising pinning an oil within the nanopores.

10. The method according to claim 6, wherein said decomposing step comprises heating said film to a sufficient temperature for a sufficient time to produce a nanoscale spinodal decomposition.

11. The method according to claim 1, wherein a composition of said substrate is different from said film and said decomposed film.

12. The method according to claim 6, wherein said decomposition step is performed under a non-oxidizing atmosphere.

13. The method according to claim 1, wherein said second material is different from said first material, wherein said first material is contiguous and said second material is contiguous, said first and second material forming an interpenetrating structure.

14. The method according to claim 1, wherein said nanostructured layer further comprises an etching residue disposed on said contiguous, protrusive material, said etching residue from a recessive contiguous material interpenetrating with said protruding material.

15. The method according to claim 3, wherein applying the continuous hydrophobic coating to the plurality of spaced apart nanostrucutured features renders the nanostructured surface layer superhydrophobic, such that the nanostructured surface layer exhibits a contact angle of greater than 140 degrees.

16. The method according to claim 1, wherein the nanostructured surface layer has a thickness of from 500 to 2000 nm.

17. A method of forming an article with a nanostructured surface layer, comprising:
providing a substrate;
forming a decomposed film on said substrate;
etching said decomposed film to form the nanostructured surface layer comprising a plurality of spaced apart nanostructured features comprising a contiguous, protrusive material, wherein said nanostructured features are sufficiently small that said nanostructured layer is optically transparent, wherein said nanostructured layer comprises nanopores formed by said plurality of spaced apart nanostructured features; and
pinning an oil within said nanopores, wherein the oil is held in place within said nanopores by at least one selected from the group consisting of a surface tension force, a van der Waals force, and combinations thereof.

18. The method according to claim 17, wherein the oil is selected from the group consisting of an alkane, and alkene, and alkyne, esters thereof, a polysiloxane, and combinations thereof.

19. The method according to claim 17, wherein the oil is contained in at least 70% of the nanopores of the nanostructured surface layer.

20. The method according to claim 17, wherein the pinned oil is positioned at an air-nanostructure layer interface defining an inner air phase between the pinned oil and the nanostructured layer.

* * * * *